United States Patent
Cai et al.

(10) Patent No.: US 9,922,883 B2
(45) Date of Patent: Mar. 20, 2018

(54) METHOD FOR MAKING STRAINED SEMICONDUCTOR DEVICE AND RELATED METHODS

(71) Applicants: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

(72) Inventors: Xiuyu Cai, Niskayuna, NY (US); Qing Liu, Watervliet, NY (US); Ruilong Xie, Niskayuna, NY (US); Chun-Chen Yeh, Clifton Park, NY (US)

(73) Assignees: INTERNATIONAL BUSINESS MACHINES CORPORATION, Armonk, NY (US); GLOBALFOUNDRIES INC., Grand Cayman (KY); STMICROELECTRONICS, INC., Coppell, TX (US)

(*) Notice: Subject to any disclaimer, the term of this patent is extended or adjusted under 35 U.S.C. 154(b) by 0 days.

(21) Appl. No.: 15/180,158

(22) Filed: Jun. 13, 2016

(65) Prior Publication Data
US 2016/0293494 A1 Oct. 6, 2016

Related U.S. Application Data

(62) Division of application No. 14/296,818, filed on Jun. 5, 2014, now Pat. No. 9,406,751.

(51) Int. Cl.
*H01L 27/12* (2006.01)
*H01L 21/8238* (2006.01)
(Continued)

(52) U.S. Cl.
CPC ......... *H01L 21/823807* (2013.01); *H01L 21/76895* (2013.01); *H01L 21/823814* (2013.01);
(Continued)

(58) Field of Classification Search
CPC ............ H01L 29/0847; H01L 29/7842; H01L 29/7848; H01L 29/786; H01L 29/78684; H01L 27/1203
See application file for complete search history.

(56) References Cited

U.S. PATENT DOCUMENTS 8,563,384 B2  10/2013  Ranade et al.
8,853,040 B2  10/2014  Cheng et al.
(Continued)

OTHER PUBLICATIONS

List of IBM Patents or Patent Applications Treated as Related; FIS920140087US2, dated Jun. 13, 2016, p. 1-2.
(Continued)

*Primary Examiner* — Matthew Reames
(74) *Attorney, Agent, or Firm* — Cantor Colburn LLP; Steven Meyers

(57) ABSTRACT

A method for making a semiconductor device is provided. Raised source and drain regions are formed with a tensile strain-inducing material, after thermal treatment to form source drain extension regions, to thereby preserve the strain-inducing material in desired substitutional states.

20 Claims, 6 Drawing Sheets

(51) Int. Cl.
*H01L 29/08* (2006.01)
*H01L 29/786* (2006.01)
*H01L 21/84* (2006.01)
*H01L 21/768* (2006.01)
*H01L 29/78* (2006.01)

(52) U.S. Cl.
CPC ............... *H01L 21/823871* (2013.01); *H01L 21/823878* (2013.01); *H01L 21/84* (2013.01); *H01L 27/1203* (2013.01); *H01L 29/0847* (2013.01); *H01L 29/786* (2013.01); *H01L 29/7842* (2013.01); *H01L 29/7848* (2013.01); *H01L 29/78684* (2013.01)

(56) References Cited

U.S. PATENT DOCUMENTS

| 2005/0104131 | A1* | 5/2005 | Chidambarrao | H01L 21/8213 |
| | | | | 257/369 |
| 2008/0217686 | A1 | 9/2008 | Majumdar et al. | |
| 2009/0039426 | A1* | 2/2009 | Cartier | H01L 21/28079 |
| | | | | 257/344 |

OTHER PUBLICATIONS

Ding Liu, et al.,"Method for Making Strained Semiconductor Device and Related Methods", U.S. Appl. No. 14/296,818, dated Jun. 5, 2014.

\* cited by examiner

METHOD FOR MAKING STRAINED SEMICONDUCTOR DEVICE AND RELATED METHODS

DOMESTIC PRIORITY

This application is a divisional of U.S. patent application Ser. No. 14/296,818, filed Jun. 5, 2014, the disclosure of which is incorporated by reference herein in its entirety.

BACKGROUND

The present invention relates to the field of electronic devices and, more particularly, to semiconductor devices and related methods.

Some semiconductor devices utilize semiconductor-on-insulator (SOI) technology, in which a thin layer of a semiconductor (typically having a thickness of a few nanometers), such as silicon, is separated from a semiconductor substrate by a relatively thick electrically insulating layer (typically featuring a thickness of a few tens of nanometers). Integrated circuits using SOI technology offer certain advantages compared to traditional "bulk" technology for Complementary Metal Oxide Semiconductor (CMOS) integrated circuits. For example, SOI integrated circuits typically provide a lower power consumption for a same performance level.

SOI circuits may also feature a reduced stray capacitance, allowing an increase of computation speeds. Furthermore, the latch-up phenomena encountered in bulk technology may be mitigated. Such circuits are commonly used in System on Chip (SoC) and micro electro-mechanical systems (MEMS) applications. SOI circuits may also be less sensitive to ionizing radiations, making them more reliable than bulk-technology circuits in applications where radiation may induce operating problems (e.g., aerospace applications). SOI integrated circuits may include memory components such as Static Random Access Memory (SRAM), as well as logic gates.

One SOI implementation is for enhanced scaling in Ultra-thin Body and BOX (UTBB), or UTBOX, devices. UTBB cells may include an NMOS transistor and a PMOS transistor, both formed in the thin silicon layer which overlies the buried insulating oxide layer. One example UTBOX integrated circuit is disclosed in U.S. Pat. No. 8,482,070 to Flatresse et al., which is hereby incorporated herein in its entirety by reference. The integrated circuit has cells placed in a cell row having a PMOS transmitter including a ground beneath the PMOS transmitter, and an n-doped well beneath the ground and configured to apply a potential thereto. An NMOS transmitter includes a ground beneath the NMOS transmitter and a p-doped well beneath the ground and configured to apply a potential thereto.

Despite the existence of such configurations, further enhancements in SOI or UTBB devices may be desirable in some applications.

SUMMARY

A method for making a semiconductor device may include forming a buried oxide (BOX) layer and a plurality of laterally spaced-apart shallow trench isolation (STI) regions over a substrate, and forming alternating first and second semiconductor channel layers between adjacent pairs of STI regions over the BOX layer. The first semiconductor channel layer may include a first semiconductor material, and the second channel layer may include a second semiconductor material different than the first semiconductor material. The method may further include forming a respective gate over each of the first and second semiconductor channel layers, forming source and drain regions on opposing sides of the gate over the first semiconductor channel layer comprising the first semiconductor material and a first dopant to provide a compressive strain in the first semiconductor channel layer, and forming source and drain regions on opposing sides of the gate over the second semiconductor channel layer including the second semiconductor material and a second dopant different than the first dopant. The method may also include performing a thermal anneal to form source and drain extension regions in the first and second semiconductor channel layers beneath the gates, and forming raised source and drain regions over the source and drain regions over the second semiconductor channel layer and at a temperature below a temperature of the thermal anneal to provide a tensile strain in the second semiconductor channel layer. The raised source and drain regions may include a third semiconductor material different than the first and second semiconductor materials.

By way of example, the temperature of the thermal anneal may be at least 1000° C., and the raised source and drain regions may be formed at a temperature below 600° C. Furthermore, the raised source and drain regions may further include the second dopant. Also by way of example, the first semiconductor material may comprise silicon germanium, the second semiconductor material may comprise silicon, and the third semiconductor material may comprise silicon carbide.

In addition, the first dopant may comprise boron, and the second dopant may comprise phosphorus, for example. The method may also include forming respective silicide contacts over the source and drain regions over the first semiconductor channel layer, and over the raised source and drain regions.

A related semiconductor device may include a substrate, a BOX layer over the substrate, a plurality of laterally spaced-apart STI regions over the substrate, and alternating first and second semiconductor channel layers between adjacent pairs of STI regions over the BOX layer, with the first semiconductor channel layer including silicon germanium and the second channel layer comprising silicon. The semiconductor device may further include a respective gate over each of the first and second semiconductor channel layers, source and drain regions on opposing sides of the gate over the first semiconductor channel layer comprising silicon germanium and a first dopant to provide a compressive strain in the first semiconductor channel layer, and source and drain regions on opposing sides of the gate over the second semiconductor channel layer comprising silicon and a second dopant different than the first dopant. The semiconductor device may also include respective source and drain extension regions in the first and second semiconductor channel layers beneath the gates, and raised source and drain regions over the source and drain regions over the second semiconductor channel layer to provide a tensile strain in the second semiconductor channel layer, with the raised source and drain regions comprising silicon carbide.

DETAILED DESCRIPTION

Figure 1:
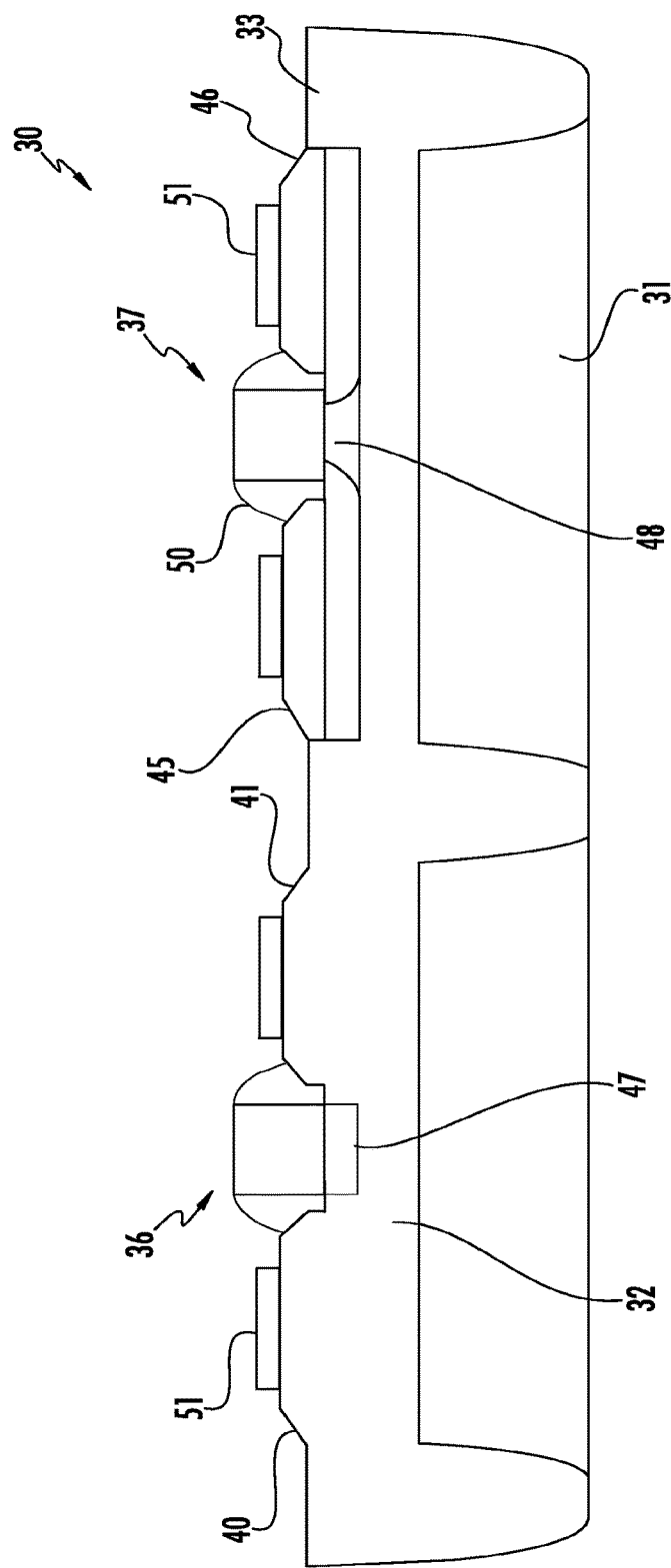
FIG. 1 is a cross-sectional diagram of a semiconductor device in accordance with an example embodiment.
Figure 2:
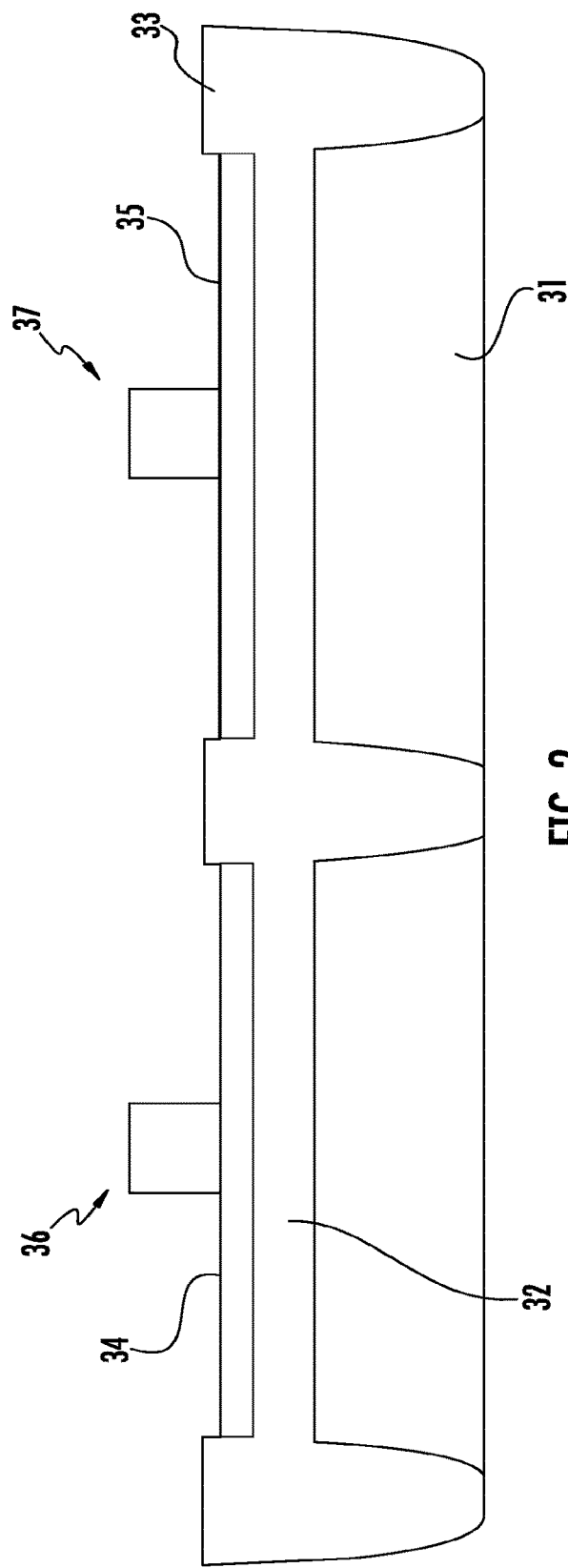
FIGS. 2, 3, 4, 5, and 6 are a series of cross-sectional diagrams illustrating a method of making the semiconductor device of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

By way of background, fully-depleted SOI (FDSOI) UTBB devices are an attractive option for CMOS scaling in advance (i.e., smaller) processing nodes. To improve device performance, channel strain is an important consideration. In particular, compressive strain is generally desired for PFET devices, while tensile strain is generally desired for NFET devices. As device pitch continues to get smaller, the strain/stress liners become less effective.

By way of example, PFET strain is usually provided by a strained silicon germanium (SiGe) channel and/or strained source/drain SiGe. While this is generally an effective approach, NFET strain may be harder to achieve. One approach to inducing strain into the silicon channel region of an NFET device is to introduce carbon atoms in the substitutional states for silicon, which can provide tensile stress. However, rapid thermal anneal (RTA) budgets typical used to form source/drain extensions in the channel region are generally higher than 900° C. Such high temperatures may take the carbon atoms out of the substitutional states, which reduces or eliminates the desired tensile strain.

Turning now to FIGS. 1-6, a semiconductor and associated method aspects are now described which allow for carbon atoms to be preserved in substitutional states to provide desired tensile strain. In the illustrated example, the method begins with a UTBB wafer including a semiconductor (e.g., silicon) substrate 31, and a buried oxide (BOX) layer 32 over or on the substrate. However, it should be noted that other SOI configurations (e.g., PDSOI, FDSOI, etc.) may be used in different embodiments. A plurality of spaced apart STI regions 33 may be formed to isolate adjacent devices from one another, as will be appreciated by those skilled in the art. In the illustrated example, the left-hand side of the illustrated embodiment is a PFET device, while the right-hand side is an NFET device, thereby forming a complementary arrangement.

Furthermore, first and second channel layers 34, 35 are formed for the PFET and NFET devices, respectively, between adjacent STI regions 33 and over the BOX layer 32. In the case of the PFET, the first channel layer 34 may be silicon germanium, while the second channel layer 35 of the NFET device may be silicon, for example, although other suitable materials may also be used. Furthermore, respective gate stacks 36, 37 may be formed on the first and second channel layers 34, 35. By way of example, high-k metal gates may be used, although other suitable gate structures may also be used in some embodiments.

Figure 3:
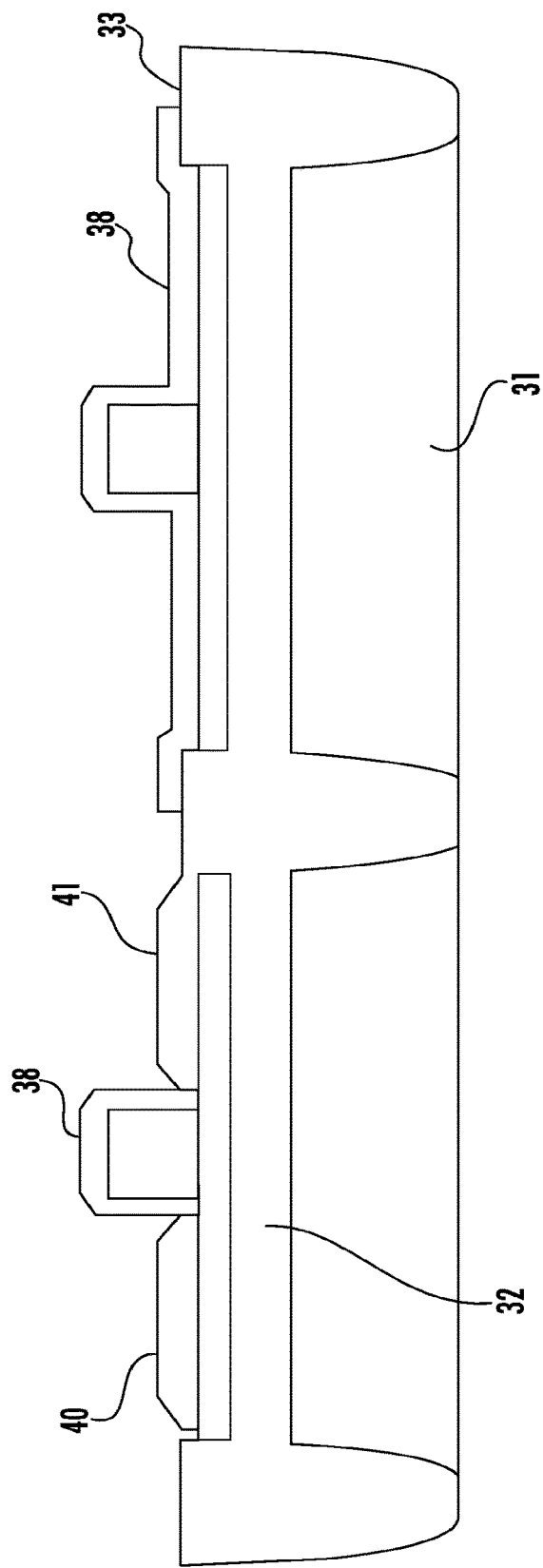

A mask layer 38 (e.g., iRAD silicon nitride) may then be formed and patterned (e.g., via lithography and reactive ion etching (ME)) to expose the silicon germanium layer 34 where PFET source and drain regions 40, 41 are to be formed, as seen in FIG. 3. The residual portions of the mask layer 38 on the sides of the PFET gate stack 36 provide sidewall spacers that separate the PFET source and drain regions 40, 41 from the PFET gate stack 36, as shown. Upon removal of the photoresist layer used for the lithography, the PFET source and drain regions 40, 41 may be formed through an in-situ boron-doped silicon germanium epitaxial growth. This boron-doped silicon germanium growth may provide further strain to the PFET channel 47, in addition to that of the first channel layer 34.

Figure 4:
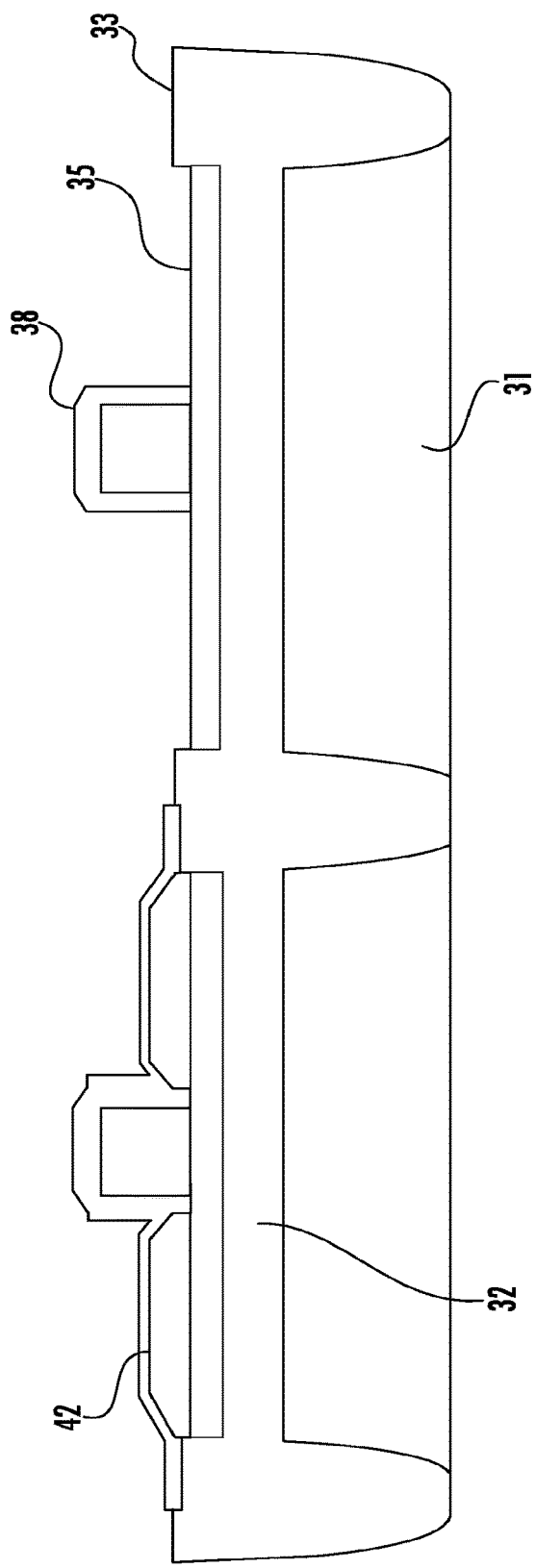
Figure 5:
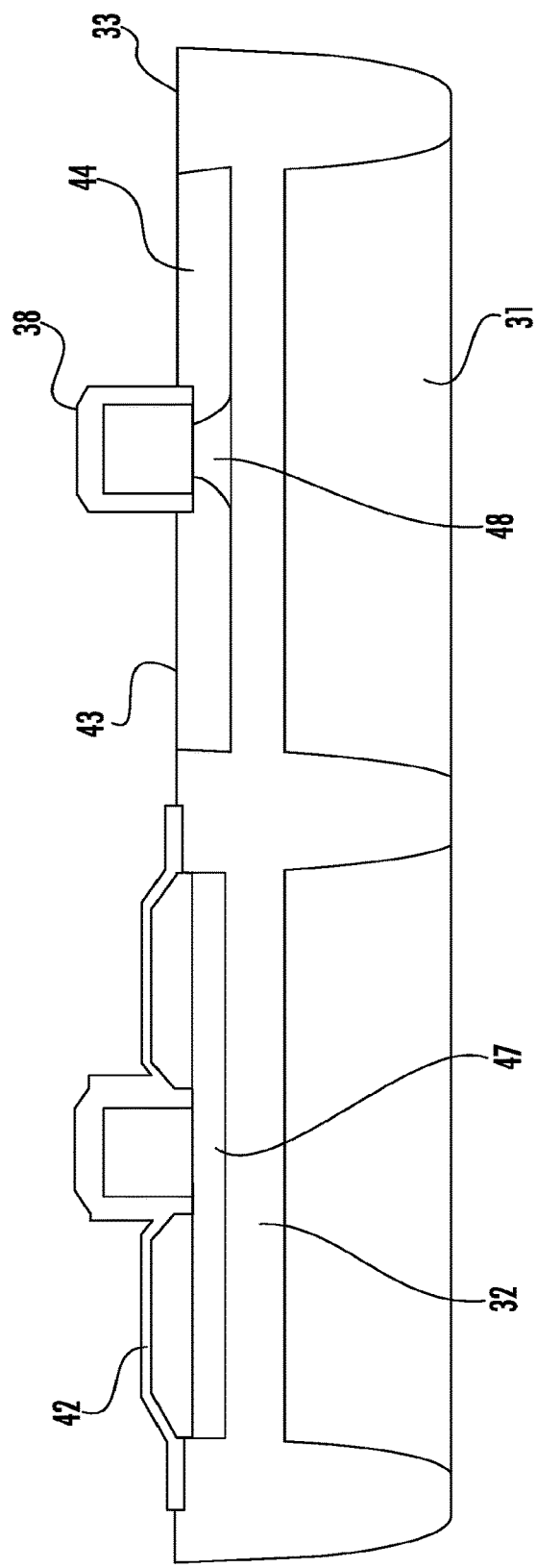

A relatively thin nitride layer 42 (e.g., silicon nitride) may be deposited to seal or protect the epitaxial growth of the PFET source and drain regions 40, 41, as seen in FIG. 4. As similarly described above, lithography and RIE processing may be performed to pattern residual portions of the nitride mask layer 38 to form spacers adjacent the NFET gate stack 37. Moreover, a relatively thin and highly in-situ phosphorous doped silicon epitaxial growth may be performed on the exposed portions of the second channel layer 35 to form NFET source and drain regions 43, 44 (FIG. 5). It should be noted that here the epitaxial growth may be relatively flat, as shown, and need not necessarily be a significantly raised growth as shown on the PFET side in the illustrated example. Moreover, a rapid thermal anneal may be performed to "drive" the first and second dopants beneath the gate stacks 36, 37, to thereby form source/drain extension regions beneath the gate stacks, as seen in FIG. 5.

Figure 6:
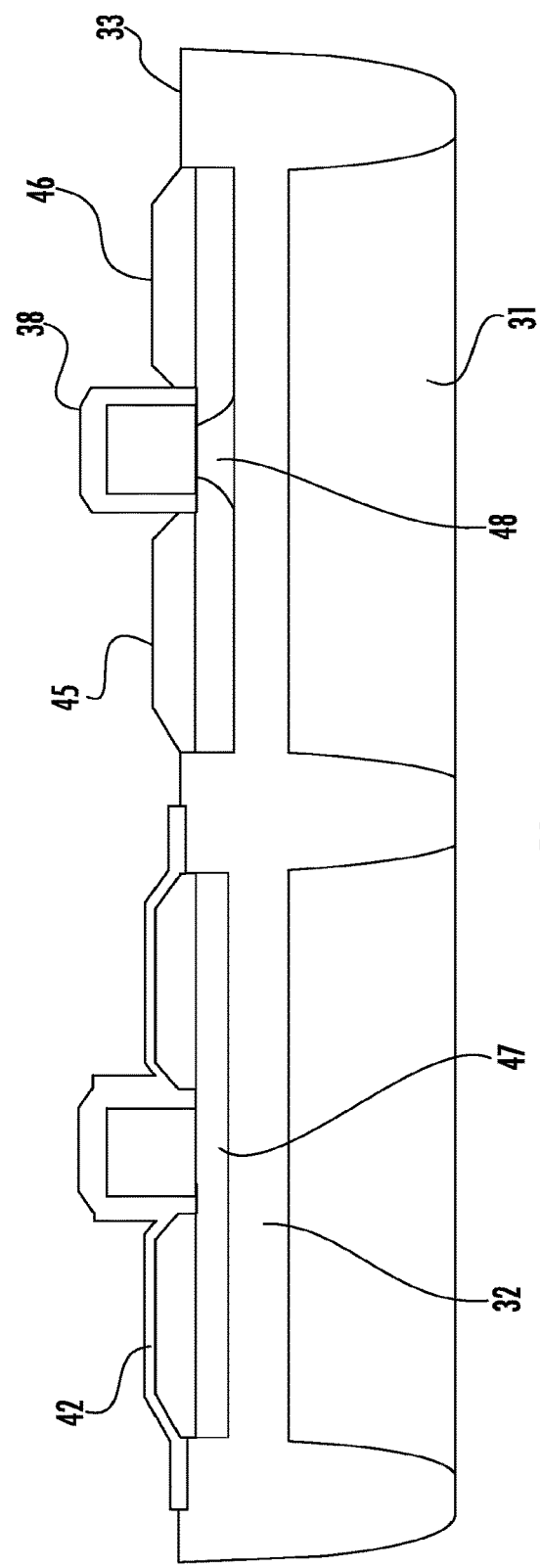

The NFET source and drain regions 43, 44 may optionally be thinned by removing (e.g., via SC1 processing, etc.) in-situ phosphorous doped silicon to provide a desired thickness, although thinning need not be performed in all embodiments. In-situ phosphorous doped silicon carbide may be epitaxially grown on top of the NFET source and drain regions 43, 44 as raised NFET source and drain regions 45, 46 (FIG. 6). As will be appreciated by those skilled in the art, the carbon in the silicon carbide is highly substitutional, to thereby provide desired tensile strain in the NFET channel 48. It should be noted that after formation of the raised NFET source and drain regions 45, 46, no further RTA processing is required, as the source/drain extension RTA has already been performed. That is, growth of the raised NFET source and drain regions 45, 46, and subsequent processing steps (e.g., MOL and BEOL) are performed at relatively low temperatures (e.g., at or below 600° C.), and well below the typical RTA temperature starting at about 900° C., or more particularly 1000° C. or higher. As seen in FIG. 1, standard processing steps may be performed to form sidewall spacers 50, silicide regions 51, and/or other appropriate structures (e.g., contacts, metal layers, etc.) to complete the given device 30.

The semiconductor device 30 and associated method aspects described above advantageously provide in-situ boron doped silicon germanium with relatively high germanium content in the source/drain regions to provide desired compressive strain to the PFET channel. Moreover, the above approach also provides for in-situ phosphorus doped silicon carbide epitaxial growth, in which carbon is in substitutional states to thereby provide desired tensile strain to the NFET channel. Thus, a relatively straightforward approach is provided to preserve the carbon atoms in substitutional states, using a relatively low (e.g., <600° C.) thermal budget after the introduction of carbon.

It should be noted that other suitable dopants and stress/strain materials may also be used in different embodiments. Moreover, it should also be noted that while the foregoing examples are described and shown with reference to planar devices, the techniques described herein may also used with non-planar (e.g., FINFET) devices, as well as nanowire devices, for example, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A semiconductor device comprising:
   a substrate;
   a buried oxide (BOX) layer over the substrate;
   a plurality of laterally spaced-apart shallow trench isolation (STI) regions over the substrate;
   alternating first and second semiconductor channel layers between adjacent pairs of STI regions over the BOX layer, the first semiconductor channel layer comprising silicon germanium and the second semiconductor channel layer comprising silicon;
   a gate formed over each of the first and second semiconductor channel layers;
   source and drain regions on opposing sides of the gate over the first semiconductor channel layer comprising silicon germanium and a first dopant causing a compressive strain in the first semiconductor channel layer;
   source and drain regions on opposing sides of the gate over the second semiconductor channel layer comprising silicon and a second dopant different than the first dopant;
   respective source and drain extension regions in the first and second semiconductor channel layers beneath each gate; and
   a raised source region and a raised drain regions formed over respective ones of the source region and the drain region over the second semiconductor channel layer causing a tensile strain in the second semiconductor channel layer, the raised source and drain regions comprising silicon carbide.

2. The semiconductor device of claim 1 wherein the raised source and drain regions further comprise the second dopant.

3. The semiconductor device of claim 1 wherein the first dopant comprises boron.

4. The semiconductor device of claim 1 wherein the second dopant comprises phosphorus.

5. The semiconductor device of claim 1 further comprising respective silicide contacts over the source and drain regions over the first semiconductor channel layer, and over the raised source and drain regions.

6. A semiconductor device comprising:
   a first semiconductor channel layer and a second semiconductor channel layer arranged between adjacent pairs of STI regions over an oxide layer on a substrate, the first semiconductor channel layer comprising a first semiconductor material and the second channel layer comprising a second semiconductor material different than the first semiconductor material;
   a gate arranged over respective ones of each of the first and second semiconductor channel layers;
   a first source region and a first drain region arranged on opposing sides of the gate arranged over the first semiconductor channel layer, each first source region and first drain region comprising the first semiconductor material and a first dopant causing a compressive strain in the first semiconductor channel layer;
   a second source region and a second drain region arranged on opposing sides of the gate arranged over the second semiconductor channel layer, each second source region and second drain region comprising the second semiconductor material and a second dopant different than the first dopant;
   a source extension region and a drain extension region thermally annealed in the first and second semiconductor channel layers beneath the gates; and
   a raised source region and a raised drain region arranged over the second source region and the second drain region, each of the raised source region and the raised drain region being formed at a temperature below a temperature of the thermally annealed source extension region and drain extension region causing a tensile strain in the second semiconductor channel layer, wherein the raised source region and the raised drain region comprises a third semiconductor material different than the first and second semiconductor materials.

7. The semiconductor device according to claim 6, wherein the source extension region and the drain extension region is thermally annealed at a temperature of at least 1000° C.

8. The semiconductor device according to claim 7, wherein the raised source region and the raised drain region are formed at a temperature below 600° C.

9. The semiconductor device according to claim 6, wherein the raised source region and the raised drain regions further comprise the second dopant.

10. The semiconductor device according to claim 6, wherein the first semiconductor material comprises silicon germanium.

11. The semiconductor device according to claim 6, wherein the second semiconductor material comprises silicon.

12. The semiconductor device according to claim 6, wherein the third semiconductor material comprises silicon carbide.

13. The semiconductor device according to claim 6, wherein the first dopant comprises boron.

14. The semiconductor device according to claim 6, wherein the second dopant comprises phosphorus.

15. The semiconductor device according to claim 6, further comprising: a silicide contact formed over corresponding ones of the first source region and the first drain region, and over the raised source region and raised drain region.

16. A semiconductor device comprising:
   a first semiconductor channel layer and a second semiconductor channel layer arranged between adjacent pairs of STI regions over an oxide layer on a substrate, the first semiconductor channel layer comprising silicon germanium and the second semiconductor channel layer comprising silicon;
   a gate formed over respective one of each of the first and second semiconductor channel layers;
   a first source region and a first drain region formed on opposing sides of the gate over the first semiconductor channel layer, the first source region and the first drain region comprising silicon germanium and a first dopant causing a compressive strain in the first semiconductor channel layer;
   a second source region and a second drain region formed on opposing sides of the gate over the second semiconductor channel layer, the second source region and the second drain region comprising silicon and a second dopant different than the first dopant;

a source extension region and a drain extension region thermally annealed in the first semiconductor channel layer and the second semiconductor channel layer beneath the each of the gates; and a raised source region and a raised drain region formed over the second source region and the second drain region, the raised source region and the raised drain region being formed at a temperature below a temperature of corresponding ones of the thermally annealed source extension region and the thermally annealed drain extension region causing a tensile strain in the second semiconductor channel layer, wherein the raised source region and the raised drain region comprises silicon carbide.

17. The semiconductor device according to claim 16, wherein the source extension region and the drain extension region are thermally annealed at a temperature of at least 1000° C.

18. The semiconductor device according to claim 17, wherein the raised source region and the raised drain region are formed at a temperature below 600° C.

19. The semiconductor device according to claim 16, wherein the raised source and the raised drain region further comprise the second dopant.

20. The semiconductor device according to claim 16, wherein the first dopant comprises boron, and the second dopant comprises phosphorus.

* * * * *